United States Patent
Wang et al.

(10) Patent No.: US 11,522,098 B2
(45) Date of Patent: Dec. 6, 2022

(54) UV/VIS/IR BACKSIDE-ILLUMINATED PHOTON-COUNTING SENSOR

(71) Applicant: TRUSTEES OF DARTMOUTH COLLEGE, Hanover, NH (US)

(72) Inventors: Zhiyuan Wang, West Lebanon, NH (US); Jiaju Ma, West Lebanon, NH (US); Jifeng Liu, Hanover, NH (US); Eric R. Fossum, Wolfeboro, NH (US); Xiaoxin Wang, Hanover, NH (US)

(73) Assignee: Trustees of Dartmouth College, Hanover, NH (US)

( * ) Notice: Subject to any disclaimer, the term of this patent is extended or adjusted under 35 U.S.C. 154(b) by 0 days.

(21) Appl. No.: 15/478,244

(22) Filed: Apr. 3, 2017

(65) Prior Publication Data
US 2018/0233620 A1 Aug. 16, 2018

Related U.S. Application Data

(60) Provisional application No. 62/317,161, filed on Apr. 1, 2016.

(51) Int. Cl.
*H01L 31/113* (2006.01)
*H01L 31/0352* (2006.01)
*H01L 27/146* (2006.01)

(52) U.S. Cl.
CPC ...... *H01L 31/1136* (2013.01); *H01L 27/1464* (2013.01); *H01L 27/14643* (2013.01); *H01L 31/035218* (2013.01)

(58) Field of Classification Search
CPC ............ H01L 31/0352; H01L 31/113; H01L 31/1133; H01L 31/1136; H01L 27/1464; H01L 27/14643
See application file for complete search history.

(56) References Cited

U.S. PATENT DOCUMENTS

| | | | | |
|---|---|---|---|---|
| 4,760,031 A | * | 7/1988 | Janesick | ............. H01L 31/1133 |
| | | | | 257/233 |
| 4,798,958 A | * | 1/1989 | Janesick | ............... H01L 27/148 |
| | | | | 365/114 |

(Continued)

FOREIGN PATENT DOCUMENTS

| | | | | |
|---|---|---|---|---|
| CN | 101471368 A | * | 7/2009 | ......... H01L 27/1461 |
| DE | 3427476 A1 | * | 10/1985 | ............. H01L 29/02 |

(Continued)

OTHER PUBLICATIONS

E. Fossum, Photon Counting Without Avalanche Multiplication-Progress on the Quanta Image Sensor, Mar. 16, 2016, Image Sensors 2016 Europe, all pages. (Year: 2016).*

(Continued)

*Primary Examiner* — Victoria K. Hall
(74) *Attorney, Agent, or Firm* — David V. Rossi; Haug Partners LLP

(57) ABSTRACT

Some embodiments of the present disclosure provide a semiconductor-based photon-counting sensor comprising a metal-insulator-semiconductor internal photoemission (e.g., thermionic-emission) detector formed on and/or in a first surface of a semiconductor substrate, and at least one jot formed on and/or in a second side of a semiconductor substrate. The at least one MIS photoemission detector and the at least one jot are configured such that a photocarrier generated in response to a photon incident on the MIS thermionic-emission detector is readout by the at least one jot.

21 Claims, 12 Drawing Sheets

(56) References Cited

U.S. PATENT DOCUMENTS

| | | | |
|---|---|---|---|
| 6,330,137 B1* | 12/2001 | Knapp | B82Y 25/00 360/324.2 |
| 9,728,565 B2* | 8/2017 | Fossum | H01L 27/1461 |
| 10,199,524 B2* | 2/2019 | Hekmatshoartabari | H01L 31/075 |
| 10,283,539 B2* | 5/2019 | Fossum | H01L 27/14612 |
| 10,319,776 B2* | 6/2019 | Ma | H01L 27/14614 |
| 10,553,629 B2* | 2/2020 | Nakamura | H01L 27/14614 |
| 10,566,367 B2* | 2/2020 | Goto | H01L 27/14689 |
| 10,573,769 B2* | 2/2020 | Miyazaki | H01L 27/1464 |
| 10,652,497 B2* | 5/2020 | Fossum | G02B 5/201 |
| 10,674,098 B1* | 6/2020 | Fossum | H04N 5/353 |
| 10,692,910 B2* | 6/2020 | Mizuta | H01L 27/1464 |
| 11,251,215 B2* | 2/2022 | Ma | H01L 27/1464 |
| 2005/0233493 A1* | 10/2005 | Augusto | G02B 1/005 438/51 |
| 2009/0096049 A1* | 4/2009 | Oshiyama | H01L 27/14645 257/E31.127 |
| 2009/0168506 A1* | 7/2009 | Han | B82Y 25/00 365/171 |
| 2010/0096718 A1* | 4/2010 | Hynecek | H01L 23/481 257/460 |
| 2011/0136288 A1* | 6/2011 | Duane | H01L 21/02381 257/E31.127 |
| 2011/0298072 A1* | 12/2011 | Chuang | H01L 27/1464 257/E31.127 |
| 2012/0008024 A1* | 1/2012 | Takimoto | H01L 27/1464 348/294 |
| 2012/0086845 A1* | 4/2012 | Enomoto | H01L 27/14614 348/311 |
| 2013/0180564 A1* | 7/2013 | Hekmatshoartabari | H01L 31/075 136/244 |
| 2013/0320419 A1* | 12/2013 | JangJian | H01L 31/028 257/E31.127 |
| 2014/0103190 A1* | 4/2014 | Lee | H01L 27/14612 250/208.1 |
| 2014/0103193 A1* | 4/2014 | Lee | H01L 27/14609 250/208.1 |
| 2014/0254620 A1* | 9/2014 | Bessette | H01L 21/0237 372/45.01 |
| 2014/0347538 A1* | 11/2014 | Toda | H01L 27/14603 348/308 |
| 2015/0041851 A1* | 2/2015 | JangJian | H01L 31/028 257/292 |
| 2016/0020236 A1* | 1/2016 | Tanaka | H01L 27/14612 257/233 |
| 2016/0027821 A1* | 1/2016 | Ahn | H01L 27/1464 257/446 |
| 2016/0126275 A1* | 5/2016 | Kurokawa | H01L 27/14669 257/43 |
| 2016/0141316 A1* | 5/2016 | Fossum | H01L 27/1461 257/228 |
| 2016/0172397 A1* | 6/2016 | Ma | H01L 27/14614 257/292 |
| 2016/0204156 A1* | 7/2016 | Togashi | H01L 23/481 257/292 |
| 2017/0018584 A1* | 1/2017 | Ma | H01L 27/14614 |
| 2017/0110500 A1* | 4/2017 | Tayanaka | H04N 5/367 |
| 2017/0208272 A1* | 7/2017 | Guidash | H01L 27/1461 |
| 2018/0006079 A1* | 1/2018 | Anzagira | H01L 27/14621 |
| 2018/0013970 A1* | 1/2018 | Fossum | H04N 5/35518 |
| 2018/0047769 A1* | 2/2018 | Fossum | H01L 27/14612 |
| 2018/0090537 A1* | 3/2018 | Ma | H01L 27/14603 |
| 2018/0227550 A1* | 8/2018 | Fossum | H04N 9/04 |
| 2019/0067367 A1* | 2/2019 | Sejima | H01L 29/82 |
| 2021/0143196 A1* | 5/2021 | Uchida | H01L 27/1464 |

FOREIGN PATENT DOCUMENTS

| | | | | |
|---|---|---|---|---|
| WO | WO 2015/006008 | * | 1/2015 | H01L 27/148 |
| WO | WO 2015/153806 | * | 10/2015 | H01L 27/146 |

OTHER PUBLICATIONS

S. Masoodian et al., A 2.5 pJ/b Binary Image Sensor as a Pathfinder for Quanta Image Sensors, Jan. 2016, IEEE Transactions on Electron Devices, vol. 63, No. 1, pp. 100-105. (Year: 2016).*

J. Ma & E. Fossum, A Pump-Gate Jot Device With High Conversion Gain for a Quanta Image Sensor, Mar. 2015, J. Electron Devices Society, vol. 3, No. 2, pp. 73-77. (Year: 2015).*

J. Ma & E. Fossum, Quanta Image Sensor Jot With Sub 0.3e-r.m.s. Read Noise and Photo Counting Capability, Sep. 2015, IEEE Electron Device Letters, vol. 36., No. 9, pp. 926-928. (Year: 2015).*

J. Ma et al., Characterization of Quanta Image Sensor Pump-Gate Jots With Deep Sub-Electron Read Noise, Nov. 2015, J. Electron Devices Society, vol. 3, No. 6, pp. 472-480. (Year: 2015).*

N. Teranishi, Required Conditions for Photon-Counting Image Sensors, Aug. 2012, IEEE Transactions on Electron Devices, vol. 59, No. 8, pp. 2199-2205. (Year: 2012).*

J. Ma et al., Quanta Image Sensor Jot with Sub 0.3e- r.m.s. Read Noise and Photon Counting Capability, IEEE Electron Device Letters, (Jul. 13, 2015), vol. 36, No. 9, pp. 926-928 (Year: 2015).*

J. Ma etal, Characterization of Quanta Image Sensor Pump-Gate Jots With Deep Sub-Electron Read Noise, (Sep. 22, 2015), Electron Devices Society, vol. 3, No. 6 (Nov. 2015), p. 472-480 (Year: 2015).*

J. Ma et al., A Pump-Gate Jot Device With High Conversion Gain for a Quanta Image Sensor, (Jan. 12, 2015); Electron Devices Society, vol. 3, No. 2 (Mar. 2015), pp. 73-77 (Year: 2015).*

Machine translation, Kemmer, German Pat. Pub. No. De 3427476A1, translation date: Oct. 24, 2020, Espacenet, all pages. (Year: 2020).*

Machine translation, Ikeda, Chinese Pat. Pub. No. CN-101471368-A, translation date: Jul. 28, 2022, Espacenet, all pages (Year: 2022).*

Zhiyuan Wang et al., "Design of nanophotonic, hot-electron solar-blind ultraviolet detectors with a metal-oxide-semiconductor structure", J. Opt 16 (2014) 125010 (6pp), IOP Publishing.

Chu-Hsuan Lin et al., "Metal-Insulator-Semiconductor Photodetectors," Sensors 2010, 10, 8797-8826; doi:10.3390/sl01008797.

Liwen Sang et al., "A Comprehensive Review of Semiconductor Ultraviolet Photodetectors: From Thin Film to One-Dimensional Nanostructures," Sensors 2013, 13, 10482-10518; doi:10.3390/s130810482.

Z. Alaie et al., "Recent advances in ultraviolet photodetectors," Materials Science in Semiconductor Processing 29 (2015) pp. 16-55.

Zhiyuan Wang et al., "Nanophotonic, Hot Electron Avalanche Solar-Blind Ultraviolet Detectors with a Metal-Oxide-Semiconductor Structure," Advanced Photonics (2015) OSA, Integrated Photonics Research, Silicon and Nanophotonics 2015 (Boston, Massachusetts United States Jun. 27-Jul. 1, 2015) ISBN: 978-1-55752-000-5 (3 pages).

Xiaoxin Wang et al., "Design of Nanophotonic MOS Solar-Blind Avalanche UV Detectors," Advanced Photonics Congress OSA 2013, paper IM2B.4 (3 pages) https://doi.org/10.1364/IPRSN.2013. IM2B.4 (Integrated Photonics Research, Silicon and Nanophotonics 2013 Rio Grande, Puerto Rico, US Jul. 14-17, 2013, ISBN: 978-1-55752-981-7).

H. Zhu et al., "Metal-Oxide-Semiconductor-Structured MgZnO Ultraviolet Photodetector with High Internal Gain," J. Phys. Chem. C 2010, 114, pp. 7169-7172.

* cited by examiner

UV/VIS/IR BACKSIDE-ILLUMINATED PHOTON-COUNTING SENSOR

RELATED APPLICATIONS

This application claims the benefit of U.S. Provisional Application No. 62/317,161, filed Apr. 1, 2016, which is hereby incorporated herein by reference in its entirety.

BACKGROUND

Ultraviolet (UV) detection has broad applications including (i) UV astronomy, (ii) flame, electrical discharge, and chemical agent detection, as well as (iii) space-to-space and secure short-range communications. A UV photon-counting detector with enough sensitivity for single UV photon detection will greatly improve the performance in those and other applications. Solar-blind and visible-blind UV detection refers to photon detection in the wavelength range of about 200 nm to about 300 nm and about 200 nm to about 390 nm, respectively, with no response in the solar spectrum and visible spectrum, respectively. Providing a detector having solar-blind or at least visible-blind functionality can be advantageous for various applications, so as to block background noise from solar light or visible light.

Similarly, an infrared (IR) single-photon detector has applicability for improving and/or enabling many fields or technologies, including, e.g., spectroscopy, Lidar, fiber-based telecommunications, and quantum information science/technology, such as quantum computation, optics, and communications (e.g., including Quantum Key distribution and other data-encryption/cryptography applications).

SUMMARY OF SOME EMBODIMENTS

Some embodiments of the present disclosure provide a semiconductor-based photon-counting sensor comprising a metal-insulator-semiconductor internal photoemission (e.g., thermionic-emission) detector formed on and/or in a first surface of a semiconductor substrate, and at least one jot formed on and/or in a second side of a semiconductor substrate. The at least one MIS photoemission detector and the at least one jot are configured such that a photocarrier generated in response to a photon incident on the MIS thermionic-emission detector is readout by the at least one jot.

In accordance with some embodiments of the present disclosure, we herein present a novel solar/visible-blind UV photon-counting detector/sensor comprising: a metal-oxide-semiconductor (MOS) structure enabling solar/visible blind character stacked on the backside of a pump-gate jot device with deep sub-electron read noise. With the proven photo-electron counting capability of the jot device, this specific device can achieve UV photon counting.

It will be appreciated that in accordance with the embodiments of the present disclosure, in such a sensor the MOS UV detector and the pump-gate jot device may be formed monolithically (i.e., on the same substrate/wafer/die), rather than a hybrid configuration wherein the MOS UV detector and the pump-gate jot device are formed on separate substrates/wafers/dies that are then stacked (e.g., bump-bonded, etc.).

Also, in accordance with some embodiments, we herein present a novel infrared (IR) photon-counting detector by using essentially the same MOS structure as for the UV detector but with different oxide and metallic materials. The insulating property of oxide layer helps reduce or eliminate dark current and other noises (signals from longer wavelengths). It also extends the working wavelength of the current Si-based IR detector with simple modification.

In some embodiments, jots may be implemented as a pump-gate jot. In view of the present disclosure, however, it will further be understood by those skilled in the art that embodiments are not limited to using pump-gate jots but may employ any jot device having the required in-pixel conversion gain to provide for photon-counting. For example, any jot device applicable to implementing a Quanta Image Sensor (QIS) may be used. And according to some embodiments, a jot does not provide avalanche gain (e.g., in some implementations, jots may not implemented as a single photon avalanche diode (SPAD)).

As used herein, the term "MOS" or the like does not mean or imply that the insulating layer of the detector (even if referred to as an MOS detector) is limited to being an oxide. "MOS" is simply used for ease of reference; dielectric materials other than oxides may be used in the so-called "MOS" detector in accordance with embodiments of the present disclosure.

Throughout the description and claims, the following terms take at least the meanings explicitly associated herein, unless the context dictates otherwise. The meanings identified below do not necessarily limit the terms, but merely provide illustrative examples for the terms.

The phrase "an embodiment" as used herein does not necessarily refer to the same embodiment, though it may. In addition, the meaning of "a," "an," and "the" include plural references; thus, for example, "an embodiment" is not limited to a single embodiment but refers to one or more embodiments. Similarly, the phrase "one embodiment" does not necessarily refer the same embodiment and is not limited to a single embodiment. As used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise.

Also, as used herein, unless the context clearly dictates otherwise, the term "sensor" or the term "detector" may embrace a discrete or single-channel sensor or detector as well as a multi-channel and/or multi-pixel sensor or detector (e.g., an image sensor comprising a one-dimensional or two-dimensional array of pixels, wherein each pixel includes a photodetector).

In addition, as used herein, unless the context clearly dictates otherwise, the term "coupled" refers to directly connected or to indirectly connected through one or more intermediate components and, in some contexts, may also denote or include electrically coupled, such as conductively coupled, capacitively coupled, and/or inductively coupled. Further, "conductively coupled" refers to being coupled via one or more intermediate components that permit energy transfer via conduction current, which is capable of including direct current as well as alternating current, while "capacitively coupled" refers to being electrostatically coupled through one or more dielectric media, and possibly also via one or more intervening conductors (e.g., via a series of capacitive components), that permit energy transfer via displacement current and not via direct current. Those skilled in the art will further understand that elements may be capacitively coupled intentionally or unintentionally (e.g., parasitically) and that in some contexts, elements said to be capacitively coupled may refer to intentional capacitive coupling. In addition, those skilled in the art will also understand that in some contexts the term "coupled" may refer to operative coupling, through direct and/or indirect connection. For instance, a conductor (e.g., control line) said to be coupled to the gate of a transistor may refer to the conductor being operable to control the gate potential so as to control the operation of the transistor (e.g., switching the transistor between "on" and "off" states), regardless of whether the conductor is connected to the gate indirectly (e.g., via another transistor, etc.) and/or directly.

It will be understood that simply for ease of reference and clarity of exposition with respect to describing, for example, cross-sectional or perspective views of pixels and/or circuitry as may be shown in the drawings, terms such as "upper," "top," "lower," "bottom," "overlying," "underlying," "above" and "below," and the like, with reference to a layer, junction, doped region, or other structure refers to a relative spatial position with respect to the perspective of the depicted view and does not denote a preferred or required orientation. In this regard, it will also be understood that such terms may not have a relation to terms such as "frontside" or "backside" with respect to the surface of the image sensor's wafer/substrate that is configured to be illuminated. For instance, depending on the viewing perspective, a first doped region may be said to overlie or be on top of a second doped region, even though the first doped region might be disposed closer to the "backside" surface of the wafer/substrate (and the image sensor may be configured for backside illumination). It is understood, therefore, as noted, that terminology such as "top," "upper," "bottom," "lower," and the like, as used herein is a convention simply for convenience and ease of reference with respect to referring to different layers, and does not otherwise impart any limitation on the overall design and/or orientation of an image sensor or pixel in accordance with the present disclosure.

In this regard, for ease of reference, as used herein, two layers, regions, or other structures/elements may be referred to as being "adjacent" if they do not include one or more intervening layers, regions (e.g., doped regions), or other structures/elements. In other words, two layers, regions, or other structures/elements referred to spatially (e.g., "on," "above," "overlying," "below," "underlying," etc.) with respect to each other may have one or more intervening layers, regions, or other structures/elements; however, use of the term "adjacent" (or, similarly, "directly," such as "directly on," "directly overlying," and the like) denotes that no intervening layers, regions, or other structures/elements are present.

Also, as used herein, "n and "p" designations (e.g., as in "n-type," "p-type," "n-well," etc.) are used in ordinary and customary manner to designate donor and acceptor type impurities that promote electron and hole carriers, respectively, as majority carriers. The term "substrate" is to be understood as a semiconductor-based material such as silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in the base semiconductor structure or foundation. In addition, the semiconductor need not be silicon-based, but may be based on, for example, silicon-germanium, germanium, or gallium arsenide.

It will be appreciated by those skilled in the art that the foregoing brief description and the following description with respect to the drawings are illustrative and explanatory of some embodiments of the present invention, and are neither representative nor inclusive of all subject matter and embodiments within the scope of the present invention, nor intended to be restrictive or characterizing of the present invention or limiting of the advantages which can be achieved by embodiments of the present invention, nor intended to require that the present invention necessarily provide one or more of the advantages described herein with respect to some embodiments. Thus, the accompanying drawings, referred to herein and constituting a part hereof, illustrate some embodiments of the invention, and, together with the detailed description, serve to explain principles of some embodiments of the invention.

BRIEF DESCRIPTION OF THE DRAWINGS

Aspects, features, and advantages of some embodiments of the invention, both as to structure and operation, will be understood and will become more readily apparent in view of the following description of non-limiting and non-exclusive embodiments in conjunction with the accompanying drawings, in which like reference numerals designate the same or similar parts throughout the various figures, and wherein.

DETAILED DESCRIPTION OF SOME EMBODIMENTS

Figure 1:
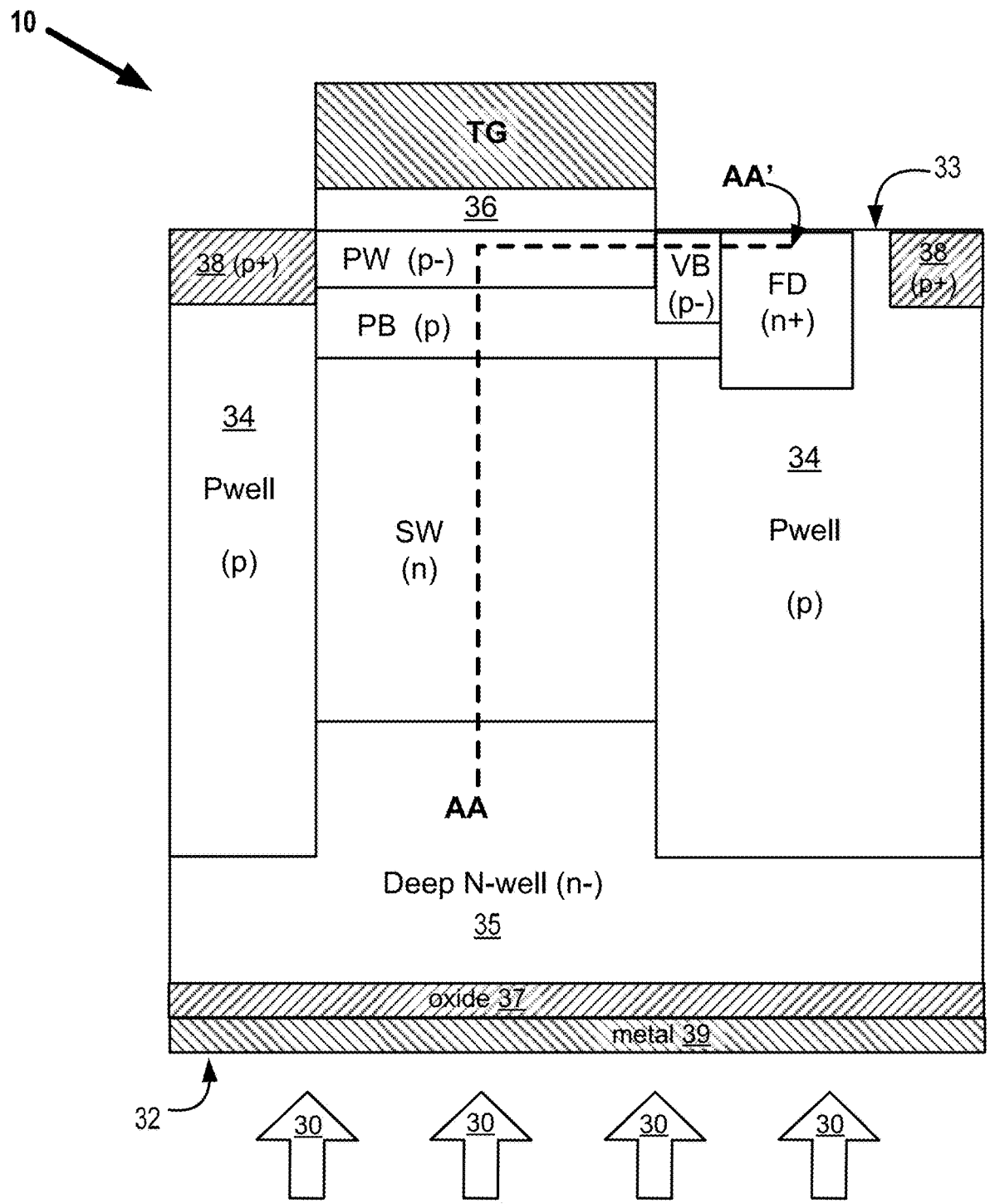
FIG. 1 depicts an illustrative cross-sectional view of a sensor comprising a metal-insulator-semiconductor detection structure and a pump-gate jot device, in accordance with some embodiments of the present disclosure.

As shown in FIG. 1, a sensor 10 according to some illustrative embodiments includes a metal-insulator-semiconductor (e.g., MOS) photodetection structure and a pump-gate jot device. As shown, the MOS photodetection structure is formed on one side (e.g., the backside) of a semiconductor substrate, and the pump gate jot device (shown in part) is formed on/in the opposite side (e.g., the front side) of the same semiconductor substrate, thus providing a monolithically integrated sensor device. In operation, the metal in the MOS structure will absorb incident photons and generate electrons that can be collected by the jot device. In accordance with some embodiments, the MOS detection structure may be implemented as a UV detector; however, depending on the application, the MOS detector may be implemented for detecting photons with energy in other regions of the visible and/or infrared (IR) spectrum. For purposes of further disclosing various embodiments, the MOS detection structure will primarily be discussed as a UV detector.

More specifically, as shown in FIG. 1, in accordance with some embodiments of a sensor according to the present disclosure, MOS photodetection structure comprises metal 39, oxide 37, and lightly doped (n−) n-well semiconductor (e.g., silicon) region 35. For clarity of exposition, FIG. 1 does not show all elements of a jot, but focuses primarily on the photocharge collection and transfer portions of the illustrative pump-gate jot. In addition, it will be understood in view of the present disclosure that the elements depicted in the embodiment of FIG. 1 may be part of a discrete sensor (e.g., a single channel) or may be part of one pixel of a image sensor comprising an array (e.g., one or two dimensional) of such pixels. At least in these respects, as further described below, a jot may include additional circuitry, such as a source-follower and reset transistor and interconnect structures, and some embodiments of a sensor implemented as an image sensor may comprise an array of such pixels (e.g., pixels arranged in rows and columns) with additional circuitry (e.g., read/row select transitors) for, e.g., reading out the array.

As shown in FIG. 1, the illustrative pump-gate jot may be fabricated on a substrate (e.g., a silicon substrate with one or more epitaxial layers) having a top surface 33 opposite a backside surface 32, and the sensor 10 may be configured for backside illumination by incident light 30. In this embodiment, the jot comprises a buried photocharge accumulation region SW, P-well regions 34, p+ pinning regions 36, n+ floating diffusion FD, p-type barrier layer PB, p-type well region PW, p type virtual barrier region VB, and a charge transfer gate stack (comprising transfer gate TG and gate dielectric 36).

As shown, SW is disposed beneath the charge transfer gate stack (comprising transfer gate TG and gate dielectric 36) that is (i) formed on top surface 33, (ii) laterally spaced away, by an intervening p-type region (implemented as lightly doped virtual barrier region VB), from a charge collection region implemented as an n+ floating diffusion FD formed in top surface 33, and (iii) operable to control a pump gate to selectively transfer charge from the photocharge accumulation region (n-well region SW) to the charge collection region (floating diffusion FD). As will be understood, in some embodiments, one or more buried p+ pinning regions may be provided laterally adjacent to (or surrounding) storage well region SW. And, as indicated, additional image sensing circuitry such as transistors and interconnect structures (not shown) may be formed on the front side 33 of the substrate.

In the depicted pixel embodiment, the storage well SW is entirely underneath the transfer gate (TG). In various embodiments, however, the lateral extent of n-well region SW may extend beyond the lateral extent of the transfer gate TG, provided that transfer gate TG is operable to fully transfer that maximum amount of charge that would be accumulated in the n-well region under normal operating conditions for which the device is designed for use. Typically, however, confining at least the n-well region to being entirely beneath the transfer gate TG is consistent with providing compact pixels (e.g., jots for QIS applications).

As noted, for clarity and ease of description, FIG. 1 depicts only a single jot device (and only a portion thereof). While some sensor embodiments may be implemented with a single jot device, it will be understood that to provide an image sensor according to some embodiments of the present disclosure, an image sensor will comprise (among other things) an array of jot devices formed on/in the semiconductor substrate, with the MOS UV detection structure extending over the surface (e.g., backside) coextensively with the opposing jot array. In some embodiments, the MOS UV detection structure may extend continuously over the backside surface (e.g., so that the continuous surface over which the array extends may produce photocarriers), whereas in some embodiments, the MOS UV detection structure may be configured as an array of MOS UV detector elements (e.g., intervening regions in the array may not provide for photoemission (e.g., may be shielded so as to be "opaque")).

Simply for clarity of exposition, it is noted that in accordance with some embodiments according to the present disclosure (such as the illustrative embodiment of FIG. 1), a jot as used herein refers to a component of the sensor that provides sufficiently high conversion gain (which is, e.g., much bigger than read noise) such that a single photocarrier generated by the MOS detector (and thus a single photon) can be detected. As such, as described in connection with the present embodiments, a jot does not itself provide photoconversion—the MOS detector is the photoconversion device. In view of the present disclosure, however, those skilled in the art may alternatively view or consider each jot as comprising at least a portion of the MOS detector at least insofar as a jot may be, in some embodiments, considered as including a photoconversion device in addition to the storage region for retaining (e.g., accumulating) photocharge generated by the photoconversion device, and the, e.g., transfer gate and floating diffusion structures for readout of single-photocarriers. But, as noted above, for clarity of exposition, the MOS photoconversion device element is referred to herein as not being part of the jot, unless the context clearly dictates otherwise.

As noted, the jots may be implemented as pump-gate jots; however, any suitable jot device (e.g., having sufficient conversion gain for single photocarrier detection) may be employed. For example, in view of the present disclosure those skilled in the art will understand that any jot device suitable for implementing a single-bit or multi-bit QIS may be used and, similarly, a jot array formed in a first surface of the substrate of a sensor according to the present disclosure may be implemented as any suitable QIS. See, e.g., each of the following publications, each of which is hereby incorporated by reference herein: (i) PCT international application publication no. WO/2015/153806 (corresponding to PCT international application no. PCT/US2015/023945), "CMOS Image Sensor with Pump Gate and Extremely High Conversion Gain," published Oct. 8, 2015, (ii) J. Ma and E. R. Fossum, A Pump-Gate Jot Device with High Conversion Gain for Quanta Image Sensors, IEEE J. Electron Devices Society, vol. 3(2), pp. 73-77, March 2015, (iii) J. Ma and E. R. Fossum, Quanta image sensor jot with sub 0.3 e– r.m.s. read noise and photon counting capability, IEEE Electron Device Letters, vol. 36(9), pp. 926-928, September 2015, (iv) J. Ma, D. Starkey, A. Rao, K. Odame, and E. R. Fossum, Characterization of quanta image sensor pump-gate jots with deep sub-electron read noise, IEEE J. Electron Devices Society, vol. 3(6), pp. 472-480, November 2015, and (v) S. Masoodian, A. Rao, J. Ma, K. Odame and E. R. Fossum, A 2.5pFb binary image sensor as a pathfinder for quanta image sensors, IEEE Trans. Electron Devices, vol. 63(1), pp. 100-105, January 2016.

The first layer 39 of the MOS structure may comprise a metal or metallic materials. For example, it may be pure metal such as Sn, Al and Au, or metal alloy such as Al—Sn, or silicide such as NiSi, PtSi, etc. The function of such metallic layer is to absorb incident photons and generate electrons with relative high excessive energy. The work function of the metallic material, which is the minimum thermodynamic energy needed to remove an electron from the solid material to vacuum outside the solid surface, will affect the working wavelength of the sensor. The details will be discussed below.

Figure 2A:
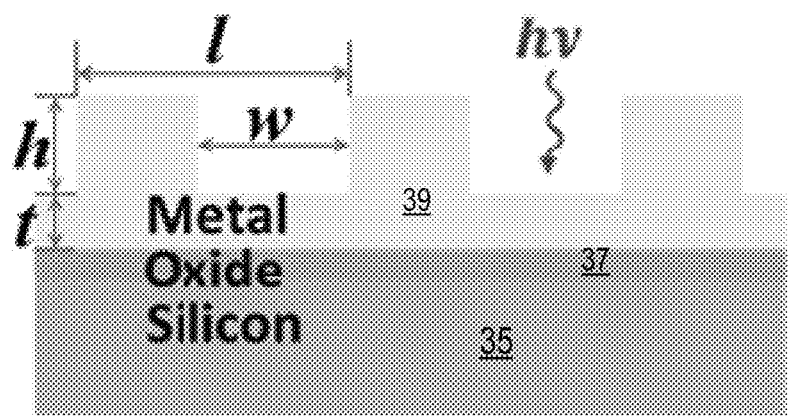
FIGS. 2A and 2B depict illustrative gratings that may be implemented in accordance with some embodiments of the present disclosure.
Figure 2B:
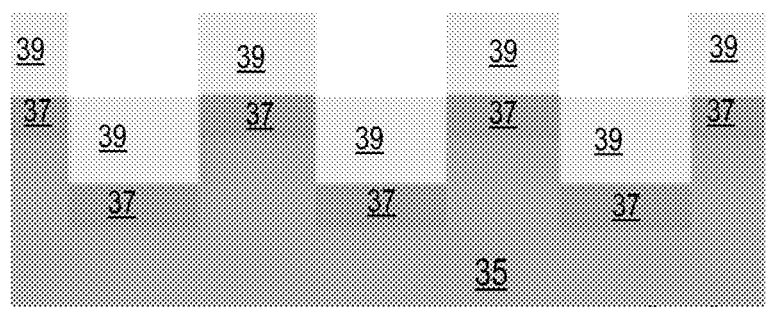

To enhance the light absorption of the metallic material, micro/nano structure can be fabricated on the layer. Such structure can be gratings with optimal period, height and width for specific working wavelength. For example, with reference to FIG. 2A, an by way of non-limiting example, a grating structure with period l of 150 nm, slit width w of 70 nm, grating height h of 20 nm, film thickness t of 20 nm has been designed for solar-blind UV detection (wavelength range from 200 nm to 300 nm). Compared to a 20 nm thick blanket thin film of Sn on oxide and Si, which has an average absorption of ~45% from 200 nm to 300 nm, this illustrative design can achieve ~80% of absorption (for TM polarized light). Another illustrative grating-type design is illustrated in FIG. 2B, in which a grating structure is first defined in the semiconductor (e.g., Si) substrate, followed by deposition of oxide and metal layers which reproduce the grating structure. Such illustrative grating-type embodiments are well-suited for maintaining uniform metal thickness throughout the whole device, keeping absorption high in all area. Other periodic or non-periodic structure can also be utilized, including structures in the shape of dots, cones, pyramids, etc. By way of non-limiting example, a two dimensional hexagonal periodic structure has been designed. The pattern comprises dots having certain diameter arranged in a hexagonal shape/array with a certain period. Once the pattern is defined on Si, oxide and metal layers can be deposited on top. By way of non-limiting example, with a period of 130 nm and a diameter of 80 nm, the average absorption is ~70% for light of any polarization.

Figure 3:
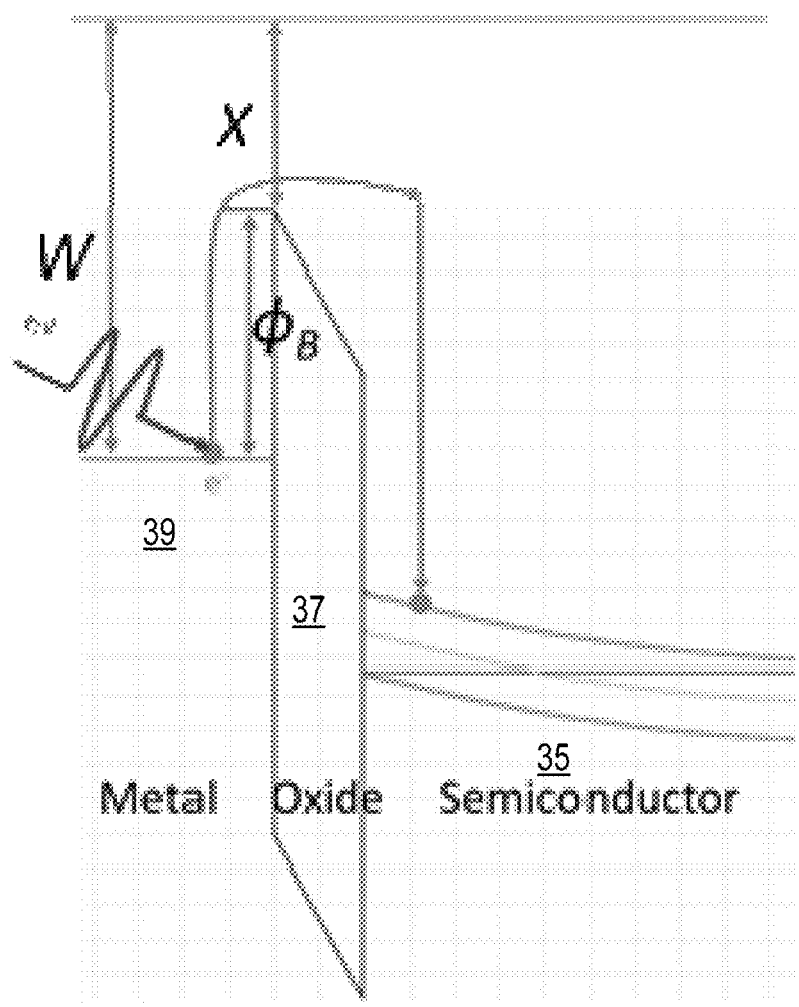
FIG. 3 depicts a schematic band diagram of an MOS structure that may be implemented in accordance with some embodiments of the present disclosure.

As will be understood by those skilled in the art, the insulator (e.g., oxide) layer 37 between conductive (e.g., metallic) material 39, and semiconductor 35 forms an interfacial barrier. A schematic band diagram of the MOS structure is shown in FIG. 3. The potential barrier height $\phi_B$ is determined by the work function of the metallic material and the electron affinity of the oxide materials. The choice of insulator 37 material can be materials with proper electron affinity and high breakdown electric field. By way of non-limiting example, possible choices of the insulator 37 material are $SiO_2$, AlN, etc. For simplicity, however, this layer 37 is referred to herein as an oxide, though it may comprise any dielectric/insulating material, not necessarily including an oxide.

When photons are absorbed in metallic structure, some of the electrons in the metallic material will gain the energy from the photons and thus become excited electrons with excessive kinetic energy. Such kinetic energy can be, for example, around 4 eV to 6 eV, according to the energy/wavelength of the incoming photons. Since kinetic energy can be described by temperature, and particles with kinetic energy of 4 eV can be considered to hold a temperature of 46000 Kelvin, these excited electrons are thus referred to as hot electrons. Upon excitation, some of these hot electrons will transport towards the oxide layer. If the energy of hot electrons is large enough, these electrons will overcome the interfacial energy barrier and reach the conduction band of semiconductor of the other side of the oxide layer. The interfacial energy barrier is large enough to prevent electron transport caused by unwanted events, such as thermal excitation, visible/infrared light excitation, etc. Note that with a large enough energy barrier, one photon can only transfer energy to no more than one electron to overcome that barrier. This makes photon counting possible in this device.

After the electrons overcome the interfacial energy barrier and reach the conduction band of Si, they will then be collected by the jot (e.g., stored in storage well SW) and generate photocurrent.

Choosing appropriate metallic and oxide material is an important factor for device performance. The working wavelength and solar/visible blind character depend on the work function of metallic material and electron affinity of oxides. As shown in FIG. 3, the potential barrier height $\phi_B$ equals to metallic material work function W minus oxide material electron affinity X.

$$\phi_B = W - X$$

The work function W can be further defined as:

$$W = -e\phi - E_F$$

where $-e$ is the charge of an electron, $\phi$ is the electrostatic potential in the vacuum nearby the surface, and $E_F$ is the Fermi level (electrochemical potential of electrons) inside the material. The barrier height $\phi_B$ determines the lowest energy of the photons that can be detected by this device. For particular light/photon, its wavelength $\lambda$ is inversely proportional to energy E:

$$E = h\frac{c}{\lambda}$$

h is Planck constant $(6.626070040(81) \times 10^{-34}$ J·s) and c is the speed of light (299792458 m/s). Thus the longest wavelength of detectable light can be calculated. For example, if the metallic material 39 is Au with work function of 5.1 eV and oxide 37 is $SiO_2$ with electron affinity of 0.9 eV, the barrier height will be 4.2 eV. This means that only photons with energy larger than 4.2 eV (in other words, wavelength shorter than 295.2 nm) can be detected. In this way, by selecting proper metallic and oxide materials, the working wavelength of the sensor can be adjusted. Solar/visible-blind character can be achieved by setting the longest working wavelength above around 300 nm/390 nm. On the other hand, not any metal will fulfill the solar/visible blind capability. For example, if the metal is Ag with a work function of 4.3 eV, and oxide is $SiO_2$, then the barrier height is 3.4 eV and the longest working wavelength is 365 nm. Thus, the Ag/SiO$_2$/Si structure can not achieve a solar-blind character, which may be important in some applications.

Figure 4:
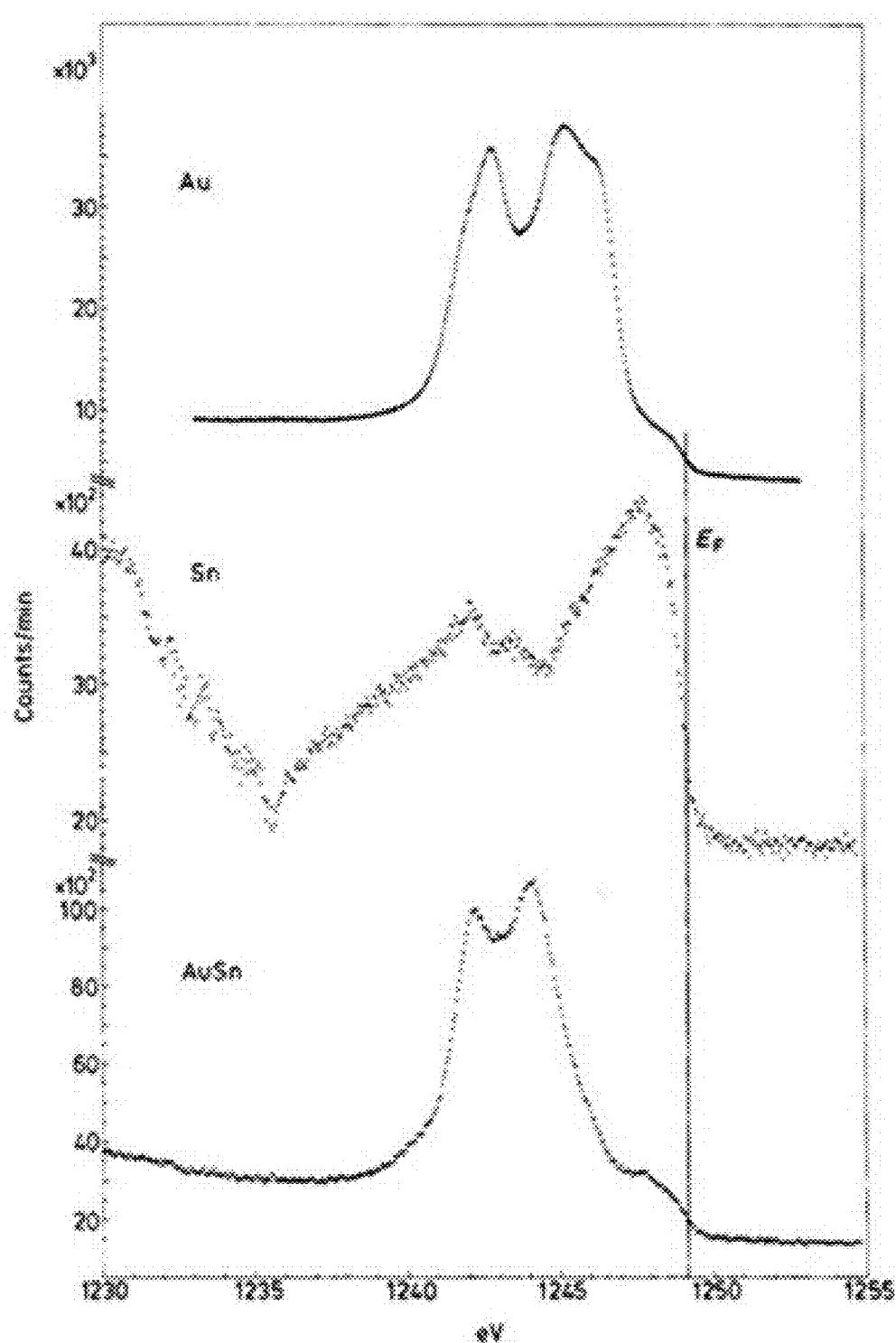
FIG. 4 depicts the measured density of states for several metals, as reproduced from reference 1 cited hereinbelow.

For electrons in metal, the density of states (DOS) near Fermi level E$_F$ will affect the efficiency of the device. For simplicity, we assume all electrons rest at the Fermi level before transport towards semiconductor side. And according to this assumption, the barrier height is determined by the metal work function. In some cases, however, electrons may rest below or above Fermi level. The distribution of electrons is described by DOS near Fermi level. For example, as shown in FIG. 4 (reproduced from Reference 1, cited hereinbelow), metal Au and Sn have different DOS near Fermi level. For Au, the peak of DOS is ~5 eV below E$_F$ while for Sn it is ~2 eV, so that means most electrons in Au will need an extra 3 eV of energy compared to most electrons in Sn given the same barrier height. It is also shown that by alloying, DOS near Fermi level can be tuned. By changing DOS near Fermi level, the effective barrier height can be changed (e.g., tuned or optimized) and/or the efficiency given a certain barrier height can be changed (e.g., tuned or optimized).

So different metals or metal alloys can be selected to achieve various DOS near Fermi level to satisfy different barrier height for all kinds of applications.

On the other hand, the thickness of both layers is also a significant factor for device efficiency. For the metallic layer 39, a thicker layer will help absorb more light and thus generate more photoelectrons. But if the layer is too thick, more hot electrons will lose their energy during transport towards the oxide layer via scattering events inside the metallic material. For example, the attenuation length of hot electrons with energy 5 eV above Fermi level is about 7 nm in Au. That means about 63% of these hot electrons will be stopped within 7 nm. With a micro/nano structure (e.g., such as the grating structures described hereinabove), it is possible to enhance local light absorption near the metal/oxide interface and thus improve hot electron transport. For the oxide layer 37, it is required to be thick enough to prevent direct tunneling of electrons with low energy and thin enough to allow ballistic transport of hot electrons with high energy (i.e. >4 eV). The good insulating property of the oxide layer not only eliminates dark current, but also prevents any photoresponse from photons absorbed by semiconductor region 35, since the oxide layer leaves the circuit open. Therefore, truly solar/visible-blind functionality may be implemented in the MOS detector structure, and therefore in sensor devices according to the present disclosure.

Figure 5:
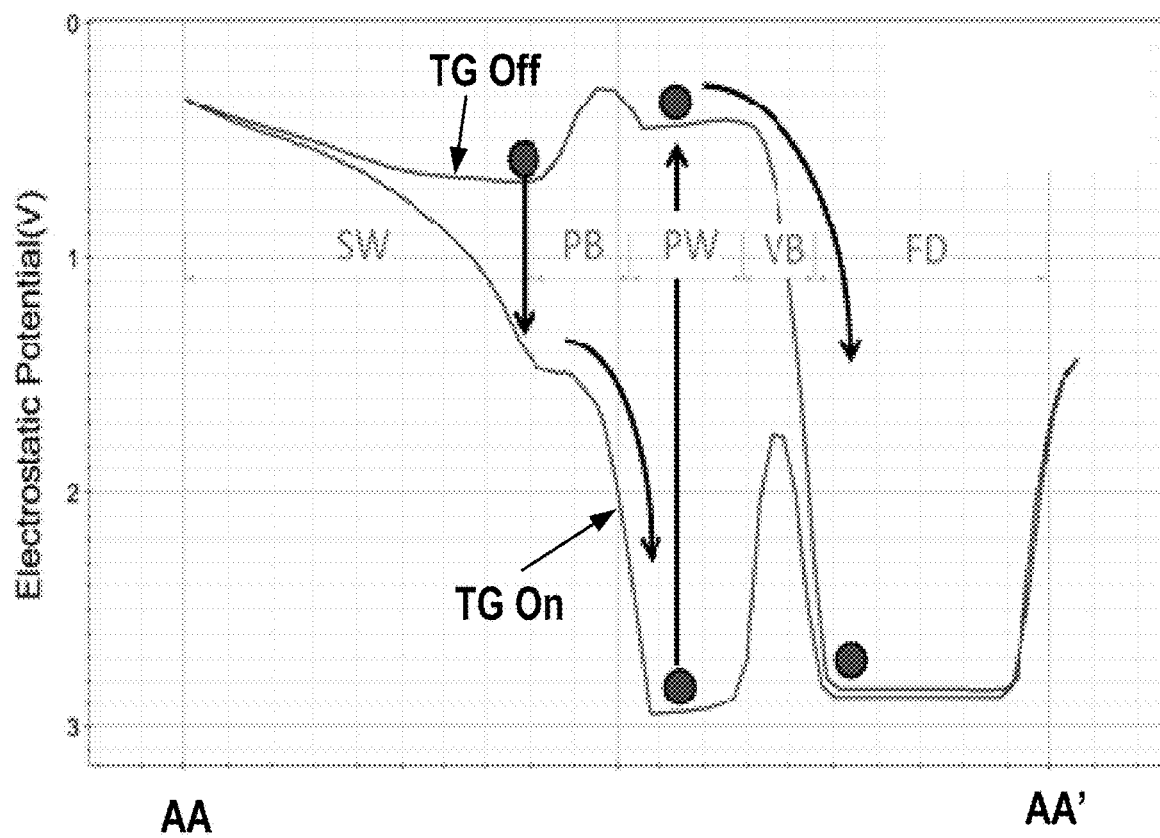
FIG. 5 depicts a potential profile along the charge transfer path AA-AA' of FIG. 1, in accordance with some embodiments of the present disclosure.

The high-energy photoelectrons will jump over the oxide potential barrier and be collected by the SW. All the electrons accumulated during one integration time will then be transferred to the floating diffusion (FD) by the pump-gate transfer gate (TG). The potential profile along the charge transfer path AA-AA' (see FIG. 1) is shown in FIG. 5. The transferred electrons lead to a voltage difference in the FD, $$\Delta V = \frac{\Delta Q}{C}.$$

By measuring the voltage difference, the number of UV photoelectrons can be detected. A high charge-to-voltage conversion gain can be achieved by the pump-gate jot, which is configured to eliminate TG-FD overlap capacitance, and may also be configured with a tapered reset gate to reduced RG-FD (reset gate-floating diffusion) overlap capacitance, as disclosed, for example, in (i) PCT international application publication no. WO/2015/153806 (corresponding to PCT international application no. PCT/US2015/023945), "CMOS Image Sensor with Pump Gate and Extremely High Conversion Gain," published Oct. 8, 2015, and (ii) J. Ma and E. R. Fossum, A Pump-Gate Jot Device with High Conversion Gain for Quanta Image Sensors, IEEE J. Electron Devices Society, vol. 3(2), pp. 73-77, March 2015, which are incorporated herein by reference in their entirety. The high conversion gain can help realize deep sub-electron read noise that achieves photoelectron counting capability. With, for example, proven 0.28 e- r.m.s. read noise, a pump-gate jot device used as the photoelectron counting part of a sensor according to embodiments of the present disclosure provides for single-photon counting UV applications.

Figure 6A:
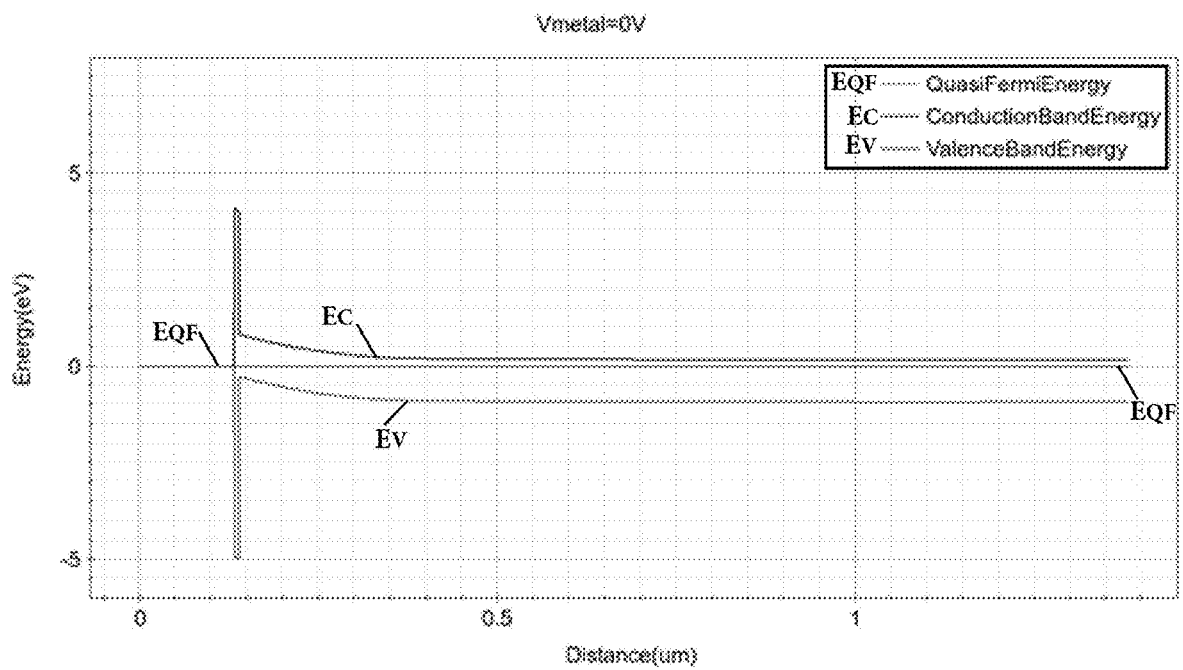
FIGS. 6A and 6B show the band diagram of metal/oxide/semiconductor region at various working voltage biases according to a TCAD simulation, in accordance with some embodiments of the present disclosure.
Figure 6B:
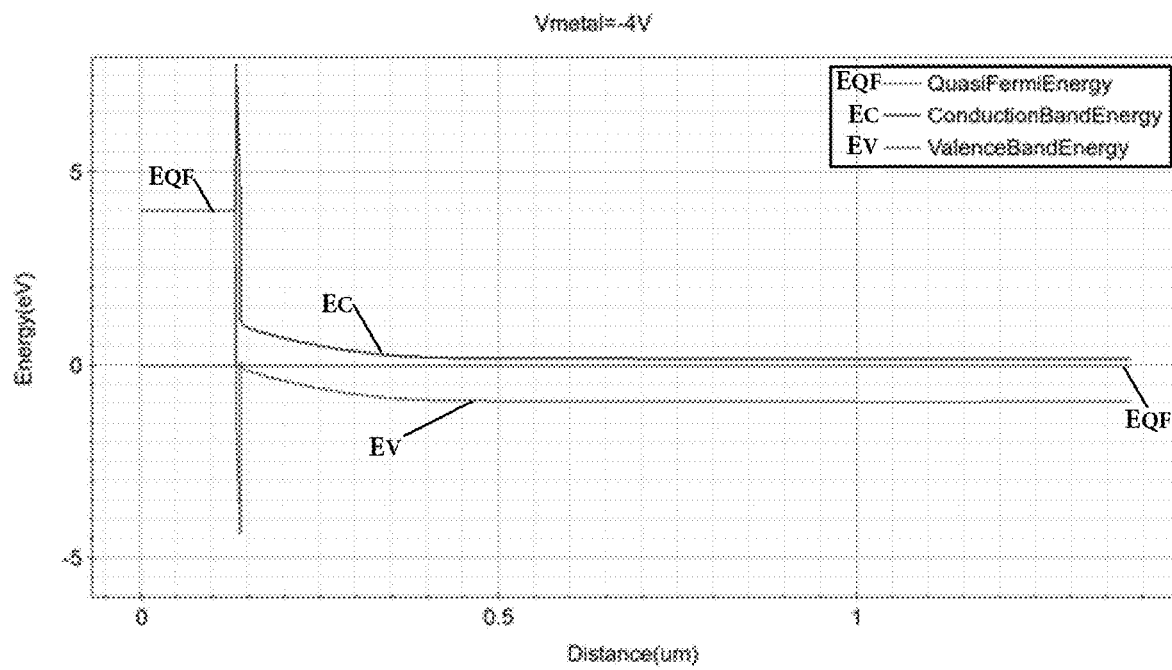
Figure 7:
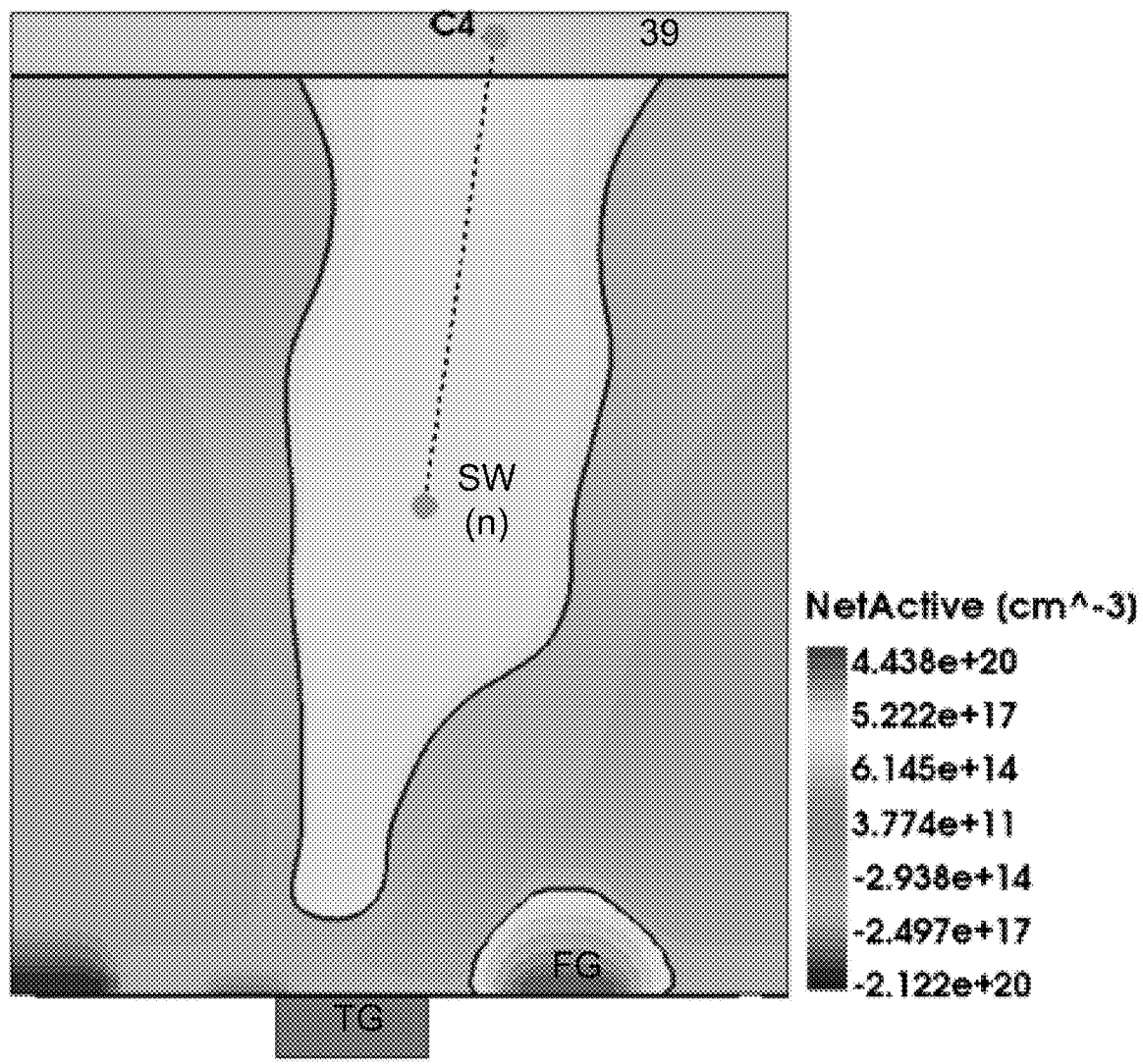
FIG. 7 depicts the doping level corresponding to the TCAD simulation of FIGS. 6A and 6B, in accordance with some embodiments of the present disclosure.
Figure 8:
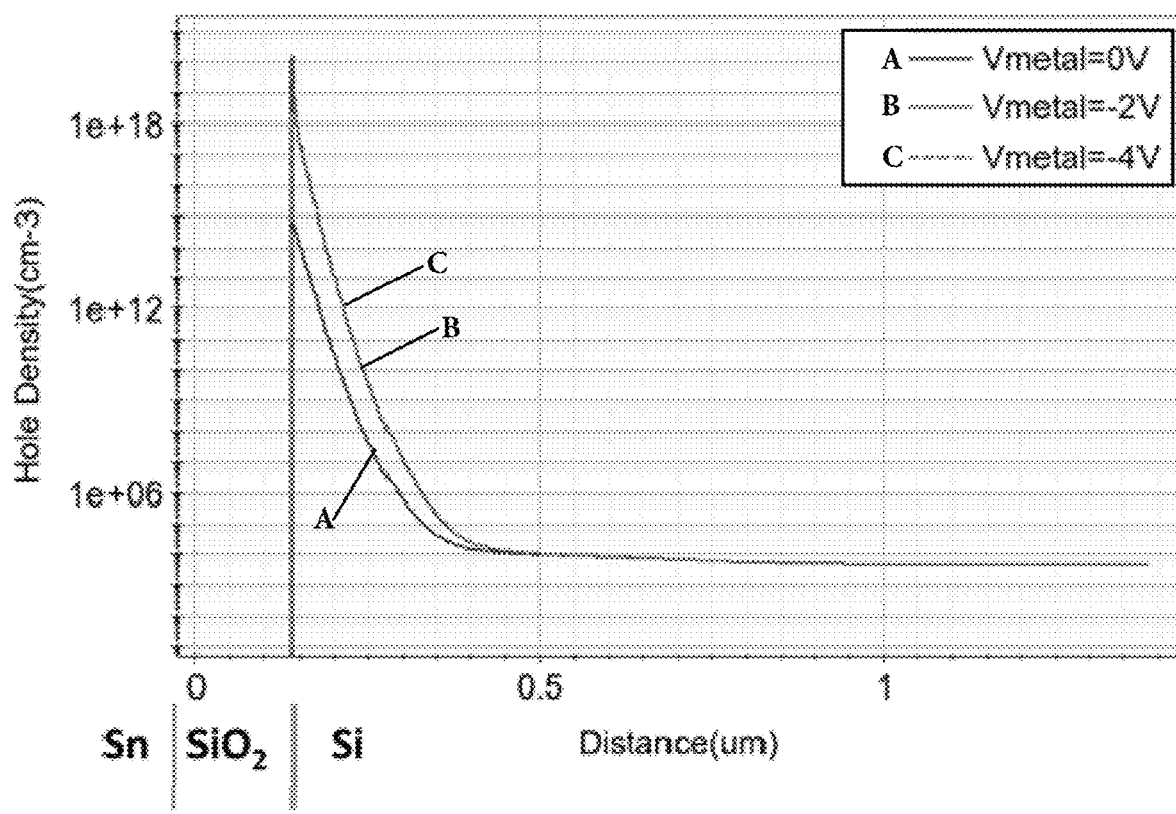
FIG. 8 depicts the hole density at different biases corresponding to the TCAD simulation of FIGS. 6A and 6B, in accordance with some embodiments of the present disclosure.

By way of non-limiting example, FIGS. 6A and 6B show the band diagram of metal/oxide/semiconductor region at various working voltage bias. It is from TCAD simulation results where Sn with work function of 4.5 eV is chosen for metal and SiO2 is chosen for oxide layer. The doping level is shown in FIG. 7. At zero bias (metal and Si has same Fermi level), the Si near the oxide interface has already been inverted to p-type. Such inversion is more apparent at working voltage bias (one typical working bias is 4V) where metal has a lower potential than the Si side. FIG. 8 also shows the hole density at different biases. It can be clearly seen that at 4V bias, namely Vgate=-4V, compared to the Si side, the hole density near SiO2/Si interface is >1e18 cm-3. This inversion layer will help quench the dark current from electrons tunneling through the SiO2. On the other hand, the photon-excited hot electrons have high kinetic energy, so they will easily transport through the inversion layer without recombining with holes. To further suppress the dark current, a sensor according to some embodiments of the present disclosure may be cooled at a lower temperature.

Figure 10:
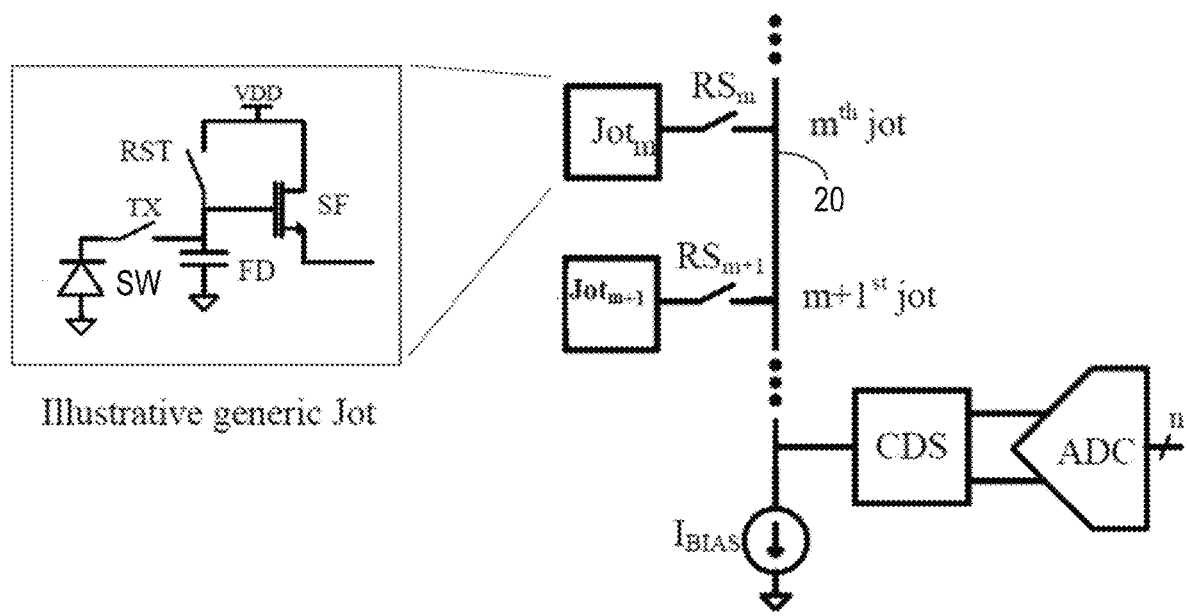
FIG. 10 schematically depicts an illustrative simplified readout signal chain associated with a column of a single bit or multi-bit jot array (e.g., QIS), in accordance with some embodiments of the present disclosure.

As noted above, and as will be understood by those skilled in the art in view of the present disclosure, a sensor comprising a jot-based device according to various embodiments of the present disclosure may be implemented as a discrete (e.g., single-channel) sensor or as an array. In accordance with some embodiments, reference is made to FIG. 10 to schematically depict an illustrative simplified readout signal chain associated with a column of a single bit or multi-bit jot array (e.g., QIS), such as may be implemented in accordance with some embodiments of the present disclosure. For clarity of exposition, only two neighboring jots (i.e., Jot$_m$ and Jot$_{m+1}$) associated with the same column bus 20 are shown, and also shown are elements comprising an illustrative generic jot, including a storage well region SW, a transfer gate TG, a floating diffusion FD (schematically depicted as a capacitance), a source-follower transistor SF, and a reset switch (e.g., transistor) RST coupled to voltage Vdd. Also, for clarity in depicting that Jot$_m$ and Jot$_{m+1}$ may be independently selectively coupled to column bus 20 (for readout), row-select switches (e.g., transistors) RS$_m$ and RS$_{m+1}$ are depicted outside of Jot$_m$ and Jot$_{m+1}$ (though the row-select switched may be considered as being part of the in-jot readout circuitry). As will be understood, during readout of each one of the jots (e.g., Jot$_m$ or Jot$_{m+1}$), jot output signals (e.g., output from in-jot source-follower amplifier SF) corresponding to the reset level and the accumulated jot signal are coupled to correlated double sampling circuitry CDS via column bus 20, resulting in a corresponding analog signal being coupled to the input of analog-to-digital converter ADC. ADC converts the input analog signal into an n-bit digital signal, wherein the bit width (n) may be one or more depending on the implementation (e.g., single bit or multi-bit). Although not shown, it will be understood that some embodiments may include a programmable gain amplifier PGA (e.g., coupled to, or included as part of, the CDS input).

Figure 11:
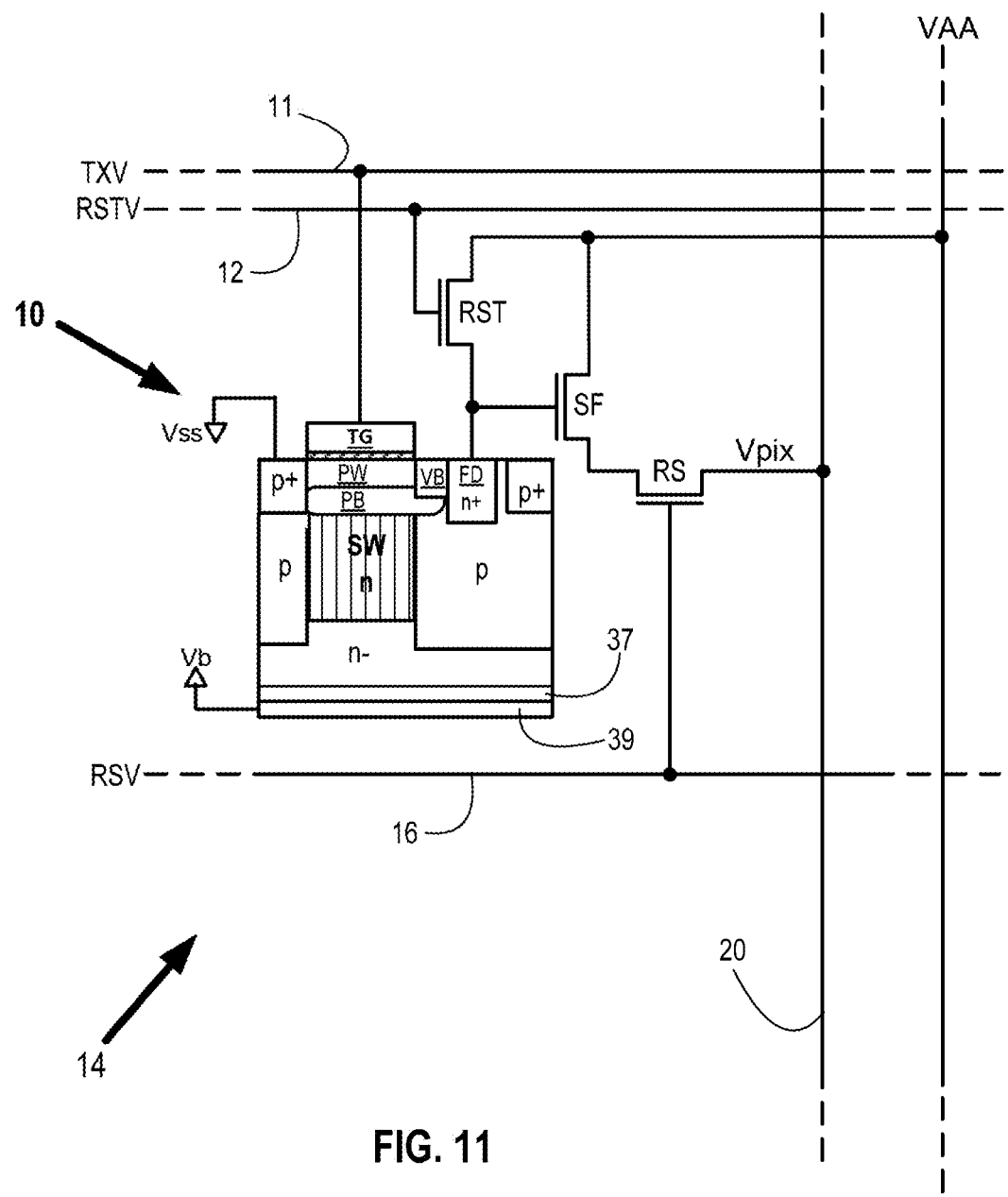
FIG. 11 schematically depicts a pixel circuit in accordance with some embodiments of the present disclosure.

FIG. 11 schematically depicts a pixel circuit 14 comprising a portion 10 such as portion 10 of FIG. 1. More specifically, simply for purposes of illustration of some illustrative variations that are possible, the portion 10 of pixel 14 in FIG. 11, while similar to portion of pixel 10 in FIG. 1, has a somewhat different layer design. Nonetheless, for purposes of the ensuing description, portion 10 of FIG. 11 functions and operates to accumulate charge in a buried-well region SW (disposed beneath a transfer gate TG) and transfer that accumulated charge to a high conversion gain floating diffusion region FD according to a vertical pump-gate mechanism under control of transfer gate TG in accordance with the function and operation of the vertical pump-gate buried-well pixel described with reference to the foregoing figures.

In operation, a row select transistor RS is activated by row select signal RSV on line 16 and connects the imager pixel 14 to a column line 20. A reset transistor RST is typically turned on by a reset signal RSTV on line 12 and the floating diffusion region FD is reset to a predetermined voltage (e.g., $V_{AA}$). Accumulation in SW of photo-electrons generated from the MOS photodetector is conducted at least during the reset period and prior to the application of a transfer gate voltage signal TXV. The transfer gate voltage signal TXV applied on line 11 to transfer gate TG is then clocked ON and OFF (as described above) to cause the accumulated charge in the buried-well SW to transfer to the collection or floating diffusion region FD.

As illustrated, the collection or floating diffusion region FD is electrically connected to the gate of a source follower transistor SF, the output of which is selectively applied to the column line 20 by row select transistor RS as pixel voltage Vpix. The reset transistor RST selectively resets the collection or floating diffusion region FD to a predetermined voltage by coupling a voltage $V_{AA}$ to the collection or floating diffusion region FD during a reset period which precedes or follows a charge accumulation or integration period. The metal 39 is coupled to a bias voltage Vb (e.g., −4V), and the p+ pinning regions are coupled to voltage Vss (e.g., ground).

Figure 12:
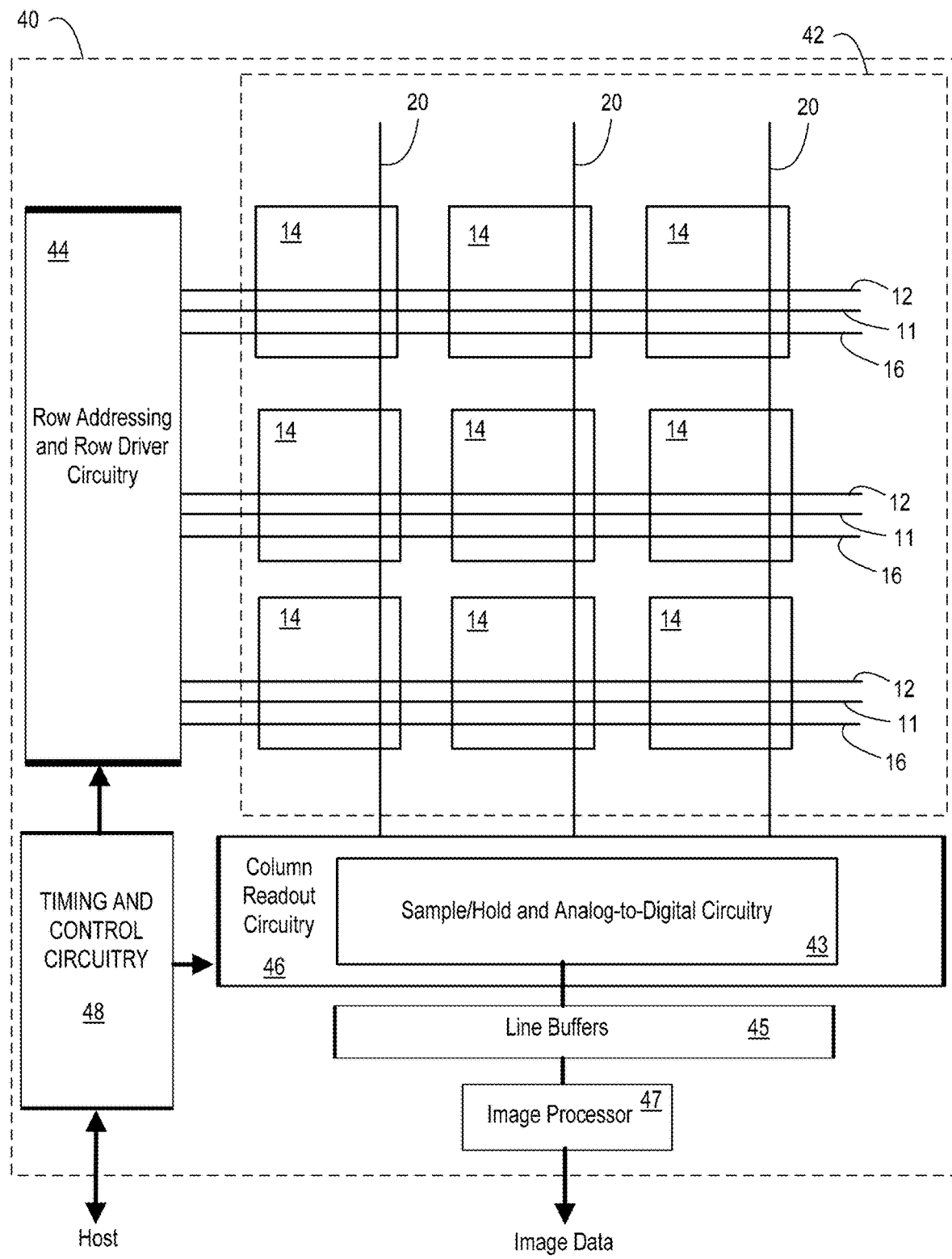
FIG. 12 depicts a block diagram of an illustrative image sensor architecture that may be used to implement embodiments in accordance with the present disclosure.

FIG. 12 depicts a block diagram of an illustrative image sensor 40 architecture that may be used to implement embodiments in accordance with the present disclosure, such as embodiments of backside-illuminated sensor comprising a UV MOS detector and a pump-gate jot array in accordance with those described hereinabove in connection with FIGS. 1 and 11. As well known, pixel array 42 typically includes a large number of pixels arranged in an M×N array; however, image sensor 40 is shown as including a simplified pixel array 42 comprising a three by three array of pixels 14, which, for ease of discussion, is a 4T pixel circuit in this embodiment (e.g., as per FIG. 11), but may be any of a variety of pixel circuit types (e.g., a reset diode may be implemented instead of a reset transistor). And, in some embodiments, the pixels may be shared pixels and may further be configured for in-pixel binning.

Row Addressing and Row Driver Circuitry 44 generates transfer gate control signals on lines 11, row select signals on lines 16, and reset gate control signals on lines 12. Column Readout Circuitry 46 includes analog-to-digital circuitry 43 for sampling and digitizing output values readout from the pixel array 42. Particularly, circuitry 43 may be implemented to comprise a plurality of A/D converters configured to implement column-parallel readout. In some embodiments, the circuitry 43 may be configured such that the readout circuitry associated with each column bus 20 may have a respective analog-to-digital converter (ADC), though in some embodiments pairs of columns may share an ADC.

Timing and control circuitry 48 controls both the row addressing and row driver circuitry 44 and the column readout circuitry 46. For instance, timing and control circuitry 48 controls the row addressing and row driver circuitry 44 for selecting the appropriate row for readout, and may, for example, provide timing control signals in accordance with rolling shutter readout or global shutter readout. As indicated in FIG. 12, timing and control circuitry 48 may also communicably interface with a host (e.g., a processor associated with a system comprising the image sensor), which may, for example, in some implementations, specify various control information.

As schematically depicted, signals on column buses 20 are sampled and digitized by circuitry 43, and the digitized pixel values provided by the ADCs may be provided to line buffers 45, which may be used to temporarily store digital signals from circuitry 43 for use by image processor 47. In general, any number of line buffers 45 may be included and, for example, each line buffer may be capable of storing digital signals representative of the charge signals that may be read from each pixel in a given row of pixels in the pixel array 42. Image processor 47 may be used to process the digital signals held in line buffers 45 to produce output image data that may be provided to a device external to the image sensor 40.

Figure 9:
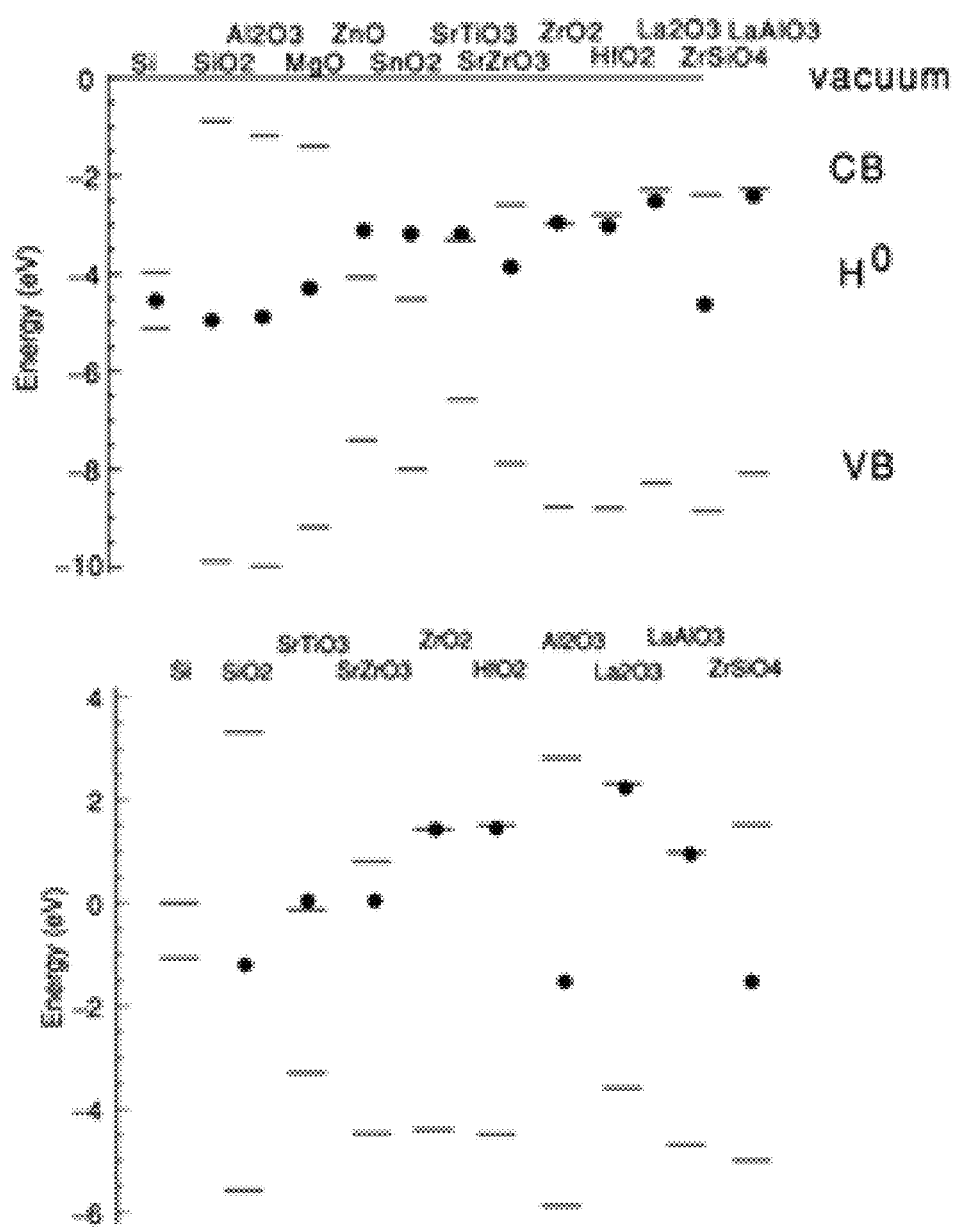
FIG. 9, reproduced from reference 2 below, depicts HO, CB, and VB energy levels for various oxide materials referenced to vacuum level using electron affinities (upper) and using the band alignments of the oxides and Si (lower), in accordance with identifying possible high-k dielectric materials for an IR device in accordance with some embodiments of the present disclosure.

In accordance with some embodiments of the present disclosure, the basic MOS structure as described hereinabove may be implemented using different metallic and/or oxide materials so as to provide a photon-counting IR detector. Generally speaking, IR light refers to light of wavelength from 700 nm to 1mm. In terms of photon energy, that is from 1.77 eV to 0.0012 eV. With various metallic and oxide materials, the barrier height can be easily tuned within this photon energy range, thus making specific IR detectors for specific target light sources. For example, if the light source has the wavelength of 900 nm, the energy barrier should be around 1.38 eV. To achieve this goal, the metallic materials can be changed (from Sn to Al, Ag) and/or the oxide materials can be changed ($TiO_2$, $SiO_2$, $SnO_2$, $La_2O_3$, etc.). Here the oxide materials may also be replaced by other dielectric materials, preferably high-k dielectric materials with relatively high electron affinity (2~4 eV). So in this case, for example, Sn may be used as metallic material (W=4.5~4.7 eV) and $Ta_2O_5$ as oxide material (X=3.2 eV). Based on preliminary literature research by the present inventors, oxide material candidates include, but are not limited to, e.g., $TiO_2$, $SiO_2$, $SnO_2$, $La_2O_3$, $Ta_2O_5$, $HfO_2$, GaN, etc. See, e.g., References [2]-[4], cited below, as well as FIG. 9.

Each of the following reference is hereby incorporated by reference herein in its entirety:

[1] An X-ray photoelectron spectroscopy of PdSb, PtBi and AuSn, P M Th M van Attekum and J M Trooster, Journal of Physics F: Metal Physics, Volume 9, Number 11

[2] Materials Fundamentals of Gate Dielectrics, Alexander A. Demkov, Alexandra Navrotsky, Springer Science & Business Media, May 24, 2006

[3] Leakage Current Mechanism of Metal-$Ta_2O_5$-Metal Capacitors for Memory Device Applications, Journal of The Electrochemical Society,146(1) 266-269 (1999)

[4] Bougrov V., Levinshtein M. E., Rumyantsev S. L., Zubrilov A., in *Properties of Advanced SemiconductorMaterials GaN, AlN, InN, BN, SiC, SiGe*. Eds. Levinshtein M. E., Rumyantsev S. L., Shur M. S., John Wiley & Sons, Inc., New York, 2001, 1-30.

Although the above description of illustrative embodiments of the present invention, as well as various illustrative modifications and features thereof, provides many specificities, these enabling details should not be construed as limiting the scope of the invention, and it will be readily understood by those persons skilled in the art that the present invention is susceptible to many modifications, adaptations, variations, omissions, additions, and equivalent implementations without departing from this scope and without diminishing its attendant advantages. For instance, except to the extent necessary or inherent in the processes themselves, no particular order to steps or stages of methods or processes described in this disclosure, including the figures, is implied. In many cases the order of process steps may be varied, and various illustrative steps may be combined, altered, or omitted, without changing the purpose, effect or import of the methods described. Similarly, the structure and/or function of a component may be combined into a single component or divided among two or more components. It is further noted that the terms and expressions have been used as terms of description and not terms of limitation. There is no intention to use the terms or expressions to exclude any equivalents of features shown and described or portions thereof. Additionally, the present invention may be practiced without necessarily providing one or more of the advantages described herein or otherwise understood in view of the disclosure and/or that may be realized in some embodiments thereof. It is therefore intended that the present invention is not limited to the disclosed embodiments but should be defined in accordance with claims that are based on the present disclosure, as such claims may be presented herein and/or in any patent applications claiming priority to, based on, and/or corresponding to the present disclosure.

What is claimed is:

1. A sensor comprising:
   at least one jot formed on and/or in a first side of a semiconductor substrate; and
   at least one metal-insulator-semiconductor (MIS) photoemission detector formed on an opposite side of the semiconductor substrate, wherein the MIS photoemission detector is configured as a solar-blind or visible-blind UV detector; and
   wherein the at least one MIS photoemission detector and the at least one jot are configured such that a photocarrier generated in response to a photon incident on the MIS photoemission detector is readout by the at least one jot.

2. The sensor according to claim 1, wherein the MIS photoemission detector formed on the opposite side of the semiconductor substrate is formed by depositing a dielectric on a surface of the opposite side, followed by depositing a conductor on the dielectric.

3. The sensor according to claim 1, wherein the at least one jot comprises an array of jots.

4. The sensor according to claim 3, wherein the array of jots is implemented as a Quanta Image Sensor (QIS).

5. The sensor according to claim 1, wherein each jot has a conversion gain of at least 500 µV.

6. The sensor according to claim 5, wherein each jot has a conversion gain of at least 1000 µV.

7. The sensor according to claim 1, wherein the MIS photoemission detector is configured as a grating.

8. The sensor according to claim 1, wherein each of the at least one jot is configured as a pump-gate jot having sufficient conversion gain to provide for detection of a single one of the photocarrier generated in response to the photon incident on the MIS photoemission detector.

9. The sensor according to claim 8, wherein the pump-gate jot is configured as a vertical pump-gate buried-well pixel.

10. The sensor according to claim 1, wherein each of the at least one jot is configured without avalanche gain.

11. The sensor according to claim 1, wherein (i) the at least one jot comprises an array of jots implemented as a Quanta Image Sensor (QIS), (ii) each of the jots is configured without avalanche gain, and (iii) each of the jots is configured as a pump-gate jot having sufficient conversion gain to provide for detection of a single one of the photocarrier generated in response to the photon incident on the MIS photoemission detector.

12. A sensor comprising:
    at least one jot formed on and/or in a first side of a semiconductor substrate; and
    at least one metal-insulator-semiconductor (MIS) photoemission detector formed on an opposite side of the semiconductor substrate, wherein the MIS photoemission detector is configured as a grating; and
    wherein the at least one MIS photoemission detector and the at least one jot are configured such that a photocarrier generated in response to a photon incident on the MIS photoemission detector is readout by the at least one jot.

13. The sensor according to claim 12, wherein the MIS photoemission detector formed on the opposite side of the semiconductor substrate is formed by depositing a dielectric on a surface of the opposite side, followed by depositing a conductor on the dielectric.

14. The sensor according to claim 12, wherein the at least one jot comprises an array of jots.

15. The sensor according to claim 14, wherein the array of jots is implemented as a Quanta Image Sensor (QIS).

16. The sensor according to claim 12, wherein the MIS photoemission detector is configured as an IR detector.

17. The sensor according to claim 12, wherein each jot has a conversion gain of at least 500 µV.

18. The sensor according to claim 17, wherein each jot has a conversion gain of at least 1000 µV.

19. The sensor according to claim 12, wherein each of the at least one jot is configured as a pump-gate jot having sufficient conversion gain to provide for detection of a single one of the photocarrier generated in response to the photon incident on the MIS photoemission detector.

20. The sensor according to claim 12, wherein each of the at least one jot is configured without avalanche gain.

21. The sensor according to claim 12, wherein (i) the at least one jot comprises an array of jots implemented as a Quanta Image Sensor (QIS), (ii) each of the jots is configured without avalanche gain, and (iii) each of the jots is configured as a pump-gate jot having sufficient conversion gain to provide for detection of a single one of the photocarrier generated in response to the photon incident on the MIS photoemission detector.

* * * * *